Dec. 19, 1967 C. R. COOK, JR 3,359,467

RESISTORS FOR INTEGRATED CIRCUITS

Filed Feb. 4, 1965

Charles R. Cook, Jr.
INVENTOR.

BY John G. Graham
ATTORNEY

United States Patent Office 3,359,467
Patented Dec. 19, 1967

3,359,467

RESISTORS FOR INTEGRATED CIRCUITS

Charles R. Cook, Jr., Lake Park, Fla., assignor to Texas Instruments Incorporated, Dallas, Tex., a corporation of Delaware Filed Feb. 4, 1965, Ser. No. 430,409
2 Claims. (Cl. 317—234)

ABSTRACT OF THE DISCLOSURE

Disclosed is a resistor for an integrated circuit which is made by forming an alloy of aluminum and silicon oxide to form the resistive region on the surface of a substrate.

This invention relates to integrated electronic circuits and more particularly to resistors utilized in integrated circuits.

One of the most significant trends in electronics is the micro-miniaturization of components and circuits. Entire circuits or functional blocks are now fabricated in or on a single wafer of semiconductor material. The transistors and other active elements in these functional blocks are created in the surface of the wafer by forming alternate layers of the semiconductor material with opposite conductivity types. Passive circuit elements, capacitors and resistors, may be formed within the wafer by diffusion techniques or on top of the wafer by coatings of appropriate materials. It is necessary, however, that the steps in fabricating the passive elements be compatible with the process steps in forming the other elements. One technique for making resistors for integrated circuits has been to form elongated diffused regions in the wafer simultaneously with one of the diffusions for the transistors. While this technique has the advantage of being wholly compatible with other necessary process steps, disadvantages are inherent in that the resistance value is somewhat restricted and difficult to reproduce, and also in that the distributed capacitance between the resistor regions and the other portions of the wafer is high. Another technique previously proposed has been to form resistors by depositing material on top of the integrated circuit wafer such as set forth in Patent No. 3,138,744, issued June 23, 1964, and assigned to the assignee of the present application.

A principal object of this invention is to provide improved resistors for integrated circuits. Another object is to provide an improved technique for fabricating deposited resistors on semiconductor wafers compatible with the other production steps for semiconductor networks. Still another object is to provide resistors for semiconductor networks which have resistivity characteristics that are reproducible and which exhibit low capacitance with the other components of the network.

In accordance with this invention, thin metal strips of shape and width suitable for the desired resistance values are provided on top of an insulating layer which covers portions of the surface of a semiconductor wafer. Each metal strip is much thinner than the deposited metal conductors ordinarily used for interconnecting leads in semiconductor networks. The wafer with metal strips overlying the insulating layer is treated so that the metal fuses into the insulating material to form the network resistors. In a preferred embodiment, a thin strip of aluminum is deposited on a silicon oxide coating on a silicon wafer. The wafer is heat treated and the deposited aluminum film alloys with the silicon oxide. This technique for producing the resistors is completely compatible with the other processes in manufacturing semiconductor networks. The temperature for heat treating is not excessive, and after heat treating the resistors are not susceptible to the etch solutions ordinarily used to define the conductive lead patterns. Ohmic contact can be easily made to the resistors by deposited aluminum or by bonded leads.

The novel features which are believed characteristic of the invention are set forth in the appended claims. The invention will best be understood, however, by reference to the following detailed description and appended claims when considered in conjunction with the accompanying drawing, in which:

Figure 1:
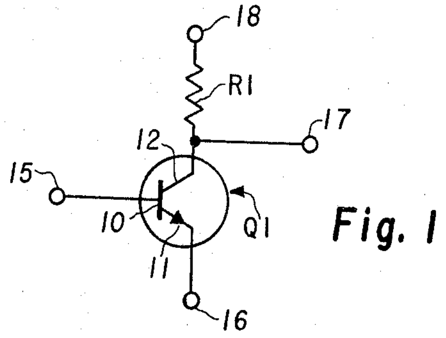
FIGURE 1 is a schematic diagram of an electrical circuit.

Referring now to FIGURE 1 of the drawing, the electrical circuit includes a transistor Q1, a contact 15 to the transistor base 10, a contact 16 to the emitter 11, a contact 17 to the collector 12, and a contact 18 to the resistor R1 which is connected to the collector 12.

Figure 2:
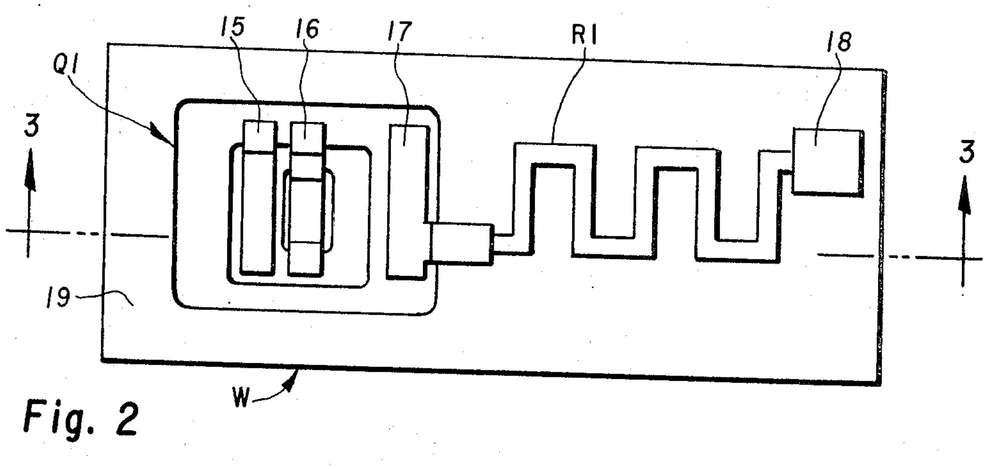
FIGURE 2 is a plan view of the circuit of FIGURE 1 physically embodied in a semiconductor wafer.

In FIGURE 2 the circuit of FIGURE 1 is physically embodied in a semiconductor wafer W. The ohmic contacts 15, 16 and 17 are attached respectively to the base, emitter and collector of the transistor Q1. The resistor R1 is formed in an insulating layer 19 in accordance with this invention. The ohmic contact 18 is attached to the resistor R1.

Figure 3:
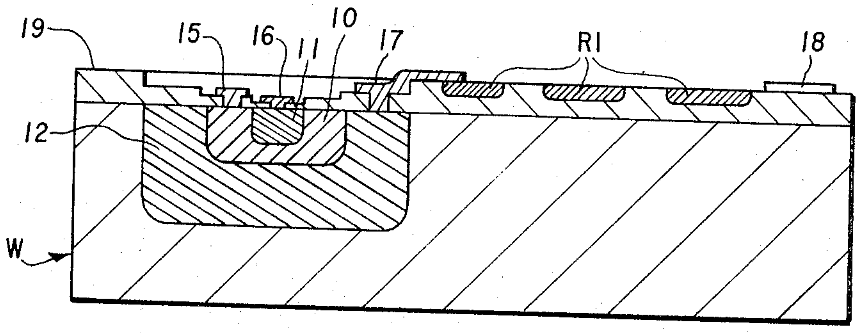
FIGURE 3 is a cross-sectional view taken along the sectional lines 3—3 in FIGURE 2.

In a preferred embodiment of this invention, the resistor R1 is produced by fusing aluminum into a silicon oxide layer. An illustrative method for producing the preferred embodiment, demonstrating the compatibility of the production technique with the other process steps in integrated circuit fabrication, will be described with reference to FIGURE 2 and FIGURE 3. Initially, the surface of a P-type semiconductor wafer W, silicon for example, is provided with a silicon oxide layer 19 of about 10,000 A. thickness. Successive masking, etching and diffusion steps, by techniques well known in the art, form the N-type collector region 12, the P-type base region 10 and the N-type emitter region 11 in one face of the wafer W. Next, a layer of aluminum 1,500 A. thick is selectively deposited on the silicon oxide layer 19 in a pattern defining the resistor R1. The wafer W is then placed in a furnace with a nitrogen or inert gas atmosphere for 5 minutes at a temperature of 700° C. to 750° C. This heat treatment, while not affecting the other component of the circuit, causes the aluminum to alloy with the silicon oxide thus forming the resistor R1. Finally, contact surfaces are provided on the base 10, the emitter 11 and the collector 12. A layer of aluminum is then deposited on the face of the wafer for the circuit contacts. The desired aluminum is masked and the unwanted aluminum is removed by etching. An important characteristic of the aluminum-silicon oxide resistor R1 is that it is not affected by etchants ordinarily employed to define the contact and conductive lead pattern. In this embodiment the deposited aluminum contact 18 is provided on the resistor R1. However, it is possible to bond a conductive lead directly to the resistor R1.

Resistors formed in accordance with this invention can have higher reproducible resistance values than resistors formed by conventional means. Also, the capacitance between the resistors of this invention and other regions of the semiconductor wafer is very small. As demonstrated in the above illustrated method for producing a preferred embodiment of the invention, the resistor process steps are compatible with the steps necessary in fabricating an integrated circuit.

It is to be understood that the disclosed embodiment and method for fabricating the same are illustrative of the principles of the invention. Numerous other arrangements may be devised by those skilled in the art without departing from the spirit and scope of the invention as defined by the appended claims.

What is claimed is:

1. An integrated circuit comprising:
(a) a wafer of semiconductor material;
(b) at least one active circuit element formed adjacent a major face of said wafer by alternate layers having opposite conductivity types;
(c) a silicon oxide coating on said major face;
(d) at least one resistor formed adjacent to the surface of said silicon oxide coating laterally spaced from said active circuit element, the resistor being composed of an aluminum-silicon oxide alloy, and
(e) conductive means overlying the oxide coating connecting the resistor to the active circuit element.

2. An integrated circuit structure, comprising:
(a) a substrate of silicon semiconductor material, with an oxide coating upon a major face of said substrate,
(b) an active circuit element within said substrate having at least two opposite conductivity regions with a P-N junction therebetween extending to said major face beneath a portion of said oxide coating,
(c) a resistor within another portion of said oxide coating laterally spaced from said active circuit element, said resistor being an integral portion of said oxide coating and being composed of an alloy of said oxide and aluminum, and
(d) a thin metallic film overlying said oxide coating and ohmically interconnecting one end of said resistor to one of said opposite conductivity regions through an aperture in said oxide coating.

References Cited

UNITED STATES PATENTS

| | | | |
|---|---|---|---|
| 3,138,744 | 6/1964 | Kilby | 317—235 |
| 3,256,587 | 6/1966 | Hangstefer | 317—235 |
| 3,266,005 | 8/1966 | Balde et al. | 338—308 |
| 3,266,127 | 8/1966 | Hardings et al. | 29—155.5 |
| 3,295,185 | 1/1967 | Pritchard et al. | 317—234 |

JOHN W. HUCKERT, *Primary Examiner.*

JAMES D. KALLAM, *Examiner.*

J. D. CRAIG, *Assistant Examiner.*